(12) United States Patent
Lin et al.

(10) Patent No.: US 7,494,884 B2
(45) Date of Patent: Feb. 24, 2009

(54) SIGE SELECTIVE GROWTH WITHOUT A HARD MASK

(75) Inventors: Hsien-Hsin Lin, Hsin-Chu (TW); Li-Te S. Lin, Hsinchu (TW); Tze-Liang Lee, Hsinchu (TW); Ming-Hua Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 54 days.

(21) Appl. No.: 11/543,435

(22) Filed: Oct. 5, 2006

(65) Prior Publication Data

US 2008/0083948 A1    Apr. 10, 2008

(51) Int. Cl.
*H01L 21/8238* (2006.01)
*H01L 21/336* (2006.01)
*H01L 21/44* (2006.01)

(52) U.S. Cl. .................. 438/300; 438/199; 438/685; 257/E21.06; 257/E21.42; 257/E21.431

(58) Field of Classification Search ................. 438/199, 438/300, 685; 257/E21.06, E21.412, E21.42, 257/E21.431
See application file for complete search history.

(56) References Cited

U.S. PATENT DOCUMENTS

| | | | | |
|---|---|---|---|---|
| 6,455,366 | B1 * | 9/2002 | Lee | 438/241 |
| 6,900,103 | B2 * | 5/2005 | Fitzgerald | 438/285 |
| 6,921,913 | B2 * | 7/2005 | Yeo et al. | 257/18 |
| 7,226,820 | B2 * | 6/2007 | Zhang et al. | 438/149 |
| 7,329,571 | B2 * | 2/2008 | Hoentschel et al. | 438/199 |
| 2004/0262694 | A1 * | 12/2004 | Chidambaram | 257/369 |
| 2005/0079692 | A1 | 4/2005 | Samoilov et al. | |
| 2005/0280098 | A1 * | 12/2005 | Shin et al. | 257/371 |
| 2007/0235802 | A1 * | 10/2007 | Chong et al. | 257/346 |

* cited by examiner

*Primary Examiner*—Alexander G Ghyka
*Assistant Examiner*—Seahvosh J Nikmanesh
(74) *Attorney, Agent, or Firm*—Slater & Matsil, L.L.P.

(57) ABSTRACT

MOS transistors having localized stressors for improving carrier mobility are provided. Embodiments of the invention comprise a gate electrode formed over a substrate, a carrier channel region in the substrate under the gate electrode, and source/drain regions on either side of the carrier channel region. The source/drain regions include an embedded stressor having a lattice spacing different from the substrate. In a preferred embodiment, the substrate is silicon and the embedded stressor is SiGe or SiC. An epitaxy process that includes using HCl gas selectively forms a stressor layer within the crystalline source/drain regions and not on polycrystalline regions of the structure. A preferred epitaxy process dispenses with the source/drain hard mask required of conventional methods. The embedded SiGe stressor applies a compressive strain to a transistor channel region. In another embodiment, the embedded stressor comprises SiC, and it applies a tensile strain to the transistor channel region.

20 Claims, 2 Drawing Sheets

SIGE SELECTIVE GROWTH WITHOUT A HARD MASK

TECHNICAL FIELD

This invention relates generally to semiconductor devices, and more particularly to methods and structures for introducing stress into semiconductor devices in order to improve charge carrier mobility.

BACKGROUND

The continued development of metal-oxide-semiconductor field-effect transistors (MOSFET) has improved the speed, density, and cost per unit function of integrated circuits. One way to improve transistor performance is through selective application of stress to the transistor channel region. Stress distorts or strains the semiconductor crystal lattice, which affects the band alignment and charge transport properties of the semiconductor. By controlling the magnitude and distribution of stress in a finished device, manufacturers can increase carrier mobility and improve device performance. There are several existing approaches of introducing stress in the transistor channel region.

One conventional approach includes forming an epitaxial, strained silicon layer on a relaxed silicon germanium (SiGe) layer. Since the SiGe lattice is larger than Si, the SiGe layer stretches the epi-layer in the lateral direction, i.e., the silicon will be under a biaxial tensile stress. Such a stress applied to a MOS channel region is particularly effective in improving N-channel transistor performance.

With a PMOS device, a tensile stress improves performance when it is perpendicular to the channel, but it has nearly the opposite effect when it is parallel to the channel. Unlike an N-channel transistor, when a biaxial, tensile stress is applied to a PMOS channel, the two stress effects almost cancel each other out. Improved PMOS fabrication therefore includes using substrate structures that apply a compression stress to the channel. One PMOS method includes selective application of a SiGe layer within the source/drain regions.

A problem with the prior art is that the new materials and methods required of strain-engineered devices creates significant process integration issues. For example, a silicon nitride tensile film formed over a NMOS transistor may be used to improve carrier mobility. For PMOS devices, on the other hand, an embedded SiGe stressor may be formed in a silicon substrate. A problem with these approaches, however, is that using different materials at different stages of the fabrication process further complicates an already complex process. Therefore, there remains a need for using strain engineering to improve device performance without significantly adding to the cost or complexity of the manufacturing process.

SUMMARY OF THE INVENTION

These and other problems are generally reduced, solved or circumvented, and technical advantages are generally achieved, by embodiments of the present invention, which provides methods and structures for forming strained MOS devices. Preferred embodiments of the invention provide for the selective growth of stressors such as SiC or SiGe without a hard mask.

MOS transistors having localized stressors for improving carrier mobility are provided. Embodiments of the invention comprise a gate electrode formed over a substrate, a carrier channel region in the substrate under the gate electrode, and source/drain regions on either side of the carrier channel region. The source/drain regions include an embedded stressor having a lattice spacing different from the substrate. In a preferred embodiment, the substrate is silicon and the embedded stressor is SiGe. In another embodiment, the embedded stressor comprises SiC. The embedded SiGe stressor applies a compressive strain to a transistor channel region. The embedded SiC stressor applies a tensile strain to a transistor channel region Still other embodiments of the invention provide a semiconductor fabrication method. Other embodiments comprise forming a gate electrode on a substrate and forming a recess in the substrate on either side of the gate electrode. Embodiments further comprise forming an embedded stressor layer within the recess.

An epitaxy process that includes using HCl gas to selectively form SiGe or SiC within the recesses. Another embodiment uses an etchant after the epitaxy process. Preferred embodiments dispense with the hard mask required of conventional methods. Embodiments of the invention advantageously selectively form stressor layers on crystalline surfaces instead of polycrystalline surfaces. Preferably, the embedded stressor layer comprises a material having a lattice spacing different from the substrate. In an embodiment, the differences it is at least 0.2%.

Throughout the specification and in the claims, the term layer is used. A layer should not be interpreted only as a continuous or uninterrupted feature, however. As will be clear from reading the specification, the layer may be separated into distinct and isolated features (e.g., active regions or device fabrication regions). In other embodiments, a layer may refer to a continuous feature having a uniform appearance; yet, it may include regions having different physical or chemical properties.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. The intermediated stages of manufacturing a preferred embodiment of the present invention are illustrated. Throughout the various views and illustrative embodiments of the present invention.

This invention relates generally to semiconductor device fabrication and more particularly to structures and methods for strained transistors. This invention will now be described with respect to preferred embodiments in a specific context, namely the creation of a MOSFET device. It is believed that embodiments of this invention are particularly advantageous when used in this process. It is believed that embodiments described herein will benefit other applications not specifically mentioned. Therefore, the specific embodiments discussed are merely illustrative of specific ways to make and use the invention, and do not limit the scope of the invention.

Figure 1:
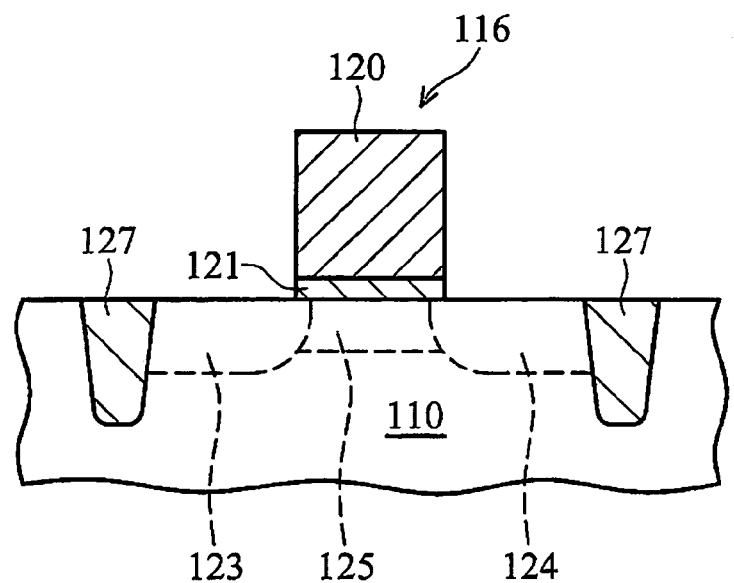
FIGS. 1-4 are cross-sectional views in the manufacture of a MOSFET according to embodiments of the invention.

FIG. 1 illustrates a MOS device 116 in an embodiment of the invention. MOS device 116 includes a substrate 110 that includes at least one active region suitable for N-channel or P-channel transistor fabrication. The active region may be isolated with shallow trench isolation (STI) regions 127 from other active regions (not shown). The substrate 110 may preferably comprise bulk silicon, doped or undoped, or an active layer of a silicon on insulator (SOI) substrate. Generally, an SOI substrate comprises a layer of a semiconductor material, such as silicon, or germanium, or silicon germanium (SGOI) formed on an insulator layer. The insulator layer may be, for example, a buried oxide (BOX) layer or a silicon oxide layer. The insulator layer is provided on a substrate, typically a silicon or glass substrate. Other substrates that may be used include multi-layered substrates, gradient substrates, or hybrid orientation substrates.

Continuing with FIG. 1, the MOS device 116 includes a source 123 and a drain 124 region. The source/drain regions are implanted using methods known in the art. Each MOS device further includes a gate electrode 120 and a gate dielectric 121. Underlying the gate electrode 120 and the gate dielectric 121 is a carrier channel region 125 connecting the source 123 and drain 124 regions. At this stage of processing, the source 123 and drain 124 regions may include lightly doped extension implants. Because a conventional source/drain implant uses the gate electrode 120 and gate electrode spacers as an implant mask, further source/drain implants may be performed after forming the electrode spacers as described below according to embodiments of the invention.

In alternative embodiments, the channel/substrate orientation may be selected with a view towards optimizing the appropriate charge carrier mobility using SOI or SGOI hybrid orientation substrates. For example, a NMOS channel may be oriented along the <100> direction, which is the direction of maximum electron mobility for a {100} substrate. Alternatively, a PMOS channel may be oriented along the <110> direction, which is the direction where hole mobility is maximum for a {110} substrate.

The gate dielectric 121 may include silicon oxide having a thickness from about 6 Å to about 100 Å, and more preferably less than about 20 Å. In other embodiments, the gate dielectric 121 may include a high-k dielectric having a k-value greater than about 4. Possible high-k dielectrics include $Ta_2O_5$, $TiO_2$, $Al_2O_3$, $ZrO_2$, $HfO_2$, $Y_2O_3$, $L_2O_3$, and their aluminates silicates. Other suitable high-k gate dielectrics may include hafnium-based materials such as $HfO_2$, $HfSiO_x$, and $HfAlO_x$. In a preferred embodiment in which the gate dielectric 121 comprises an oxide layer, the gate dielectric 121 may be formed by an oxidation process, such as wet or dry thermal oxidation in an ambient comprising an oxide, $H_2O$, NO, or a combination thereof, or by chemical vapor deposition (CVD) techniques using is tetraethylorthosilicate (TEOS) and oxygen as a precursor.

The gate electrode 120 preferably comprises a conductive material such as Ta, Ti, Mo, W, Pt, Al, Hf, Ru, and silicides or nitrides thereof; doped poly-crystalline silicon, other conductive materials, or a combination thereof. In one example, amorphous silicon is deposited and recrystallized to create poly-crystalline silicon (poly-silicon). In the preferred embodiment in which the gate electrode is poly-silicon, the gate electrode 120 may be formed by depositing doped or undoped poly-silicon by low-pressure chemical vapor deposition (LPCVD) to a thickness in the range of about 400 Å to about 2500 Å, but more preferably about 1500 Å.

The gate dielectric 121 and the gate electrode 120 may be patterned by photolithography techniques as is known in the art. Generally, photolithography involves depositing a photoresist material, which is then masked, exposed, and developed. After the photoresist mask is patterned, an etching process may be performed to remove unwanted portions of the gate dielectric material and the gate electrode material to form the gate dielectric 121 and the gate electrode 120 as illustrated in FIG. 1. In the preferred embodiment in which the gate electrode material is poly-crystalline silicon and the gate dielectric material is an oxide, the etching process may be a wet or dry, anisotropic or isotropic, etch process, but preferably is an anisotropic dry etch process.

Figure 2:
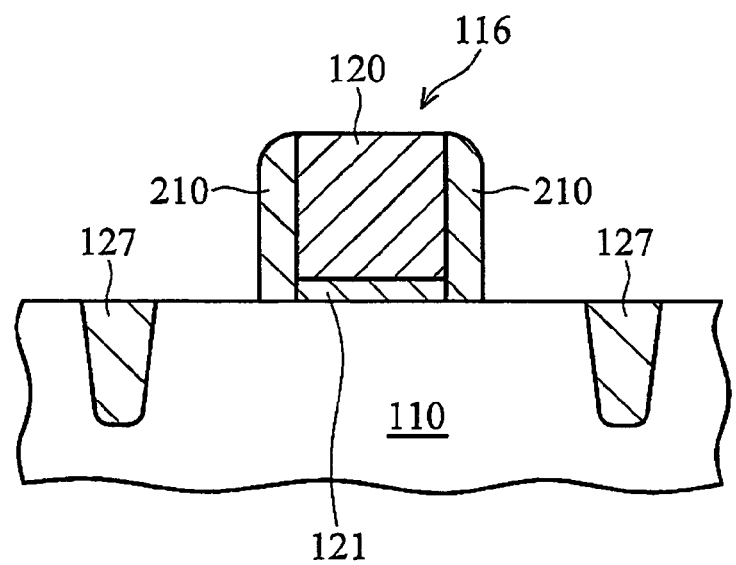

FIG. 2 illustrates the MOS device 116 of FIG. 1 after a pair of sidewall spacers 210 have been formed on opposite sides of the gate electrode 120 and gate dielectric 121. The sidewall spacers 210, serve as self aligning masks for performing one or more ion implants within the source/drain regions. The sidewall spacers 210 preferably comprise silicon nitride ($Si_3N_4$), or a nitrogen containing layer other than $Si_3N_4$, such as $Si_xN_y$, silicon oxynitride $SiO_xN_y$, silicon oxime $SiO_xN_y$:$H_z$, or a combination thereof. In a preferred embodiment, the sidewall spacers 210 are formed from a layer comprising $Si_3N_4$ that has been formed using chemical vapor deposition (CVD) techniques using silane and ammonia as precursor gases.

The sidewall spacers 210 may be patterned by performing an isotropic or anisotropic etch process, such as an isotropic etch process using a solution of phosphoric acid ($H_3PO_4$). Because the thickness of the layer of $Si_3N_4$ is greater in the regions adjacent to the gate electrode 120, the isotropic etch removes the $Si_3N_4$ material on top of the gate electrode 120 and the areas of substrate 110 not immediately adjacent to the gate electrode 120, leaving the spacer 210 as illustrated in FIG. 2. In an embodiment, the sidewall spacers 210 are from about 1 nm to about 100 nm in width. Alternatively, sidewall spacers 210 are formed by an anisotrpic etch process to achieve the resulting structure.

Figure 3:
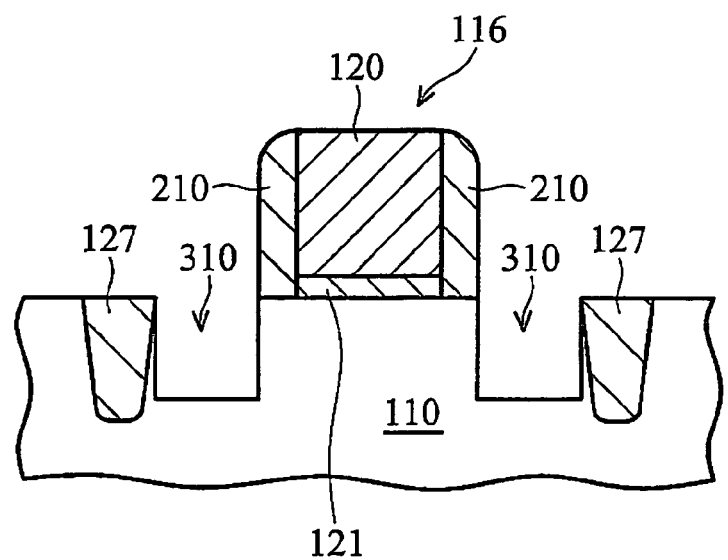

Referring now to FIG. 3, the substrate 110 is shown after an etching process has been performed to create recessed regions 310 in the substrate 110 on either side of the gate electrode 120 within the source/drain regions in accordance with an embodiment of the present invention. The recessed regions 310 may be formed by a plasma etch using fluorine, chlorine, or bromine chemistry. The recessed regions may have a depth between about 10 nm and 200 nm and preferably between about 40 mm and 140 nm. An optional anneal may be performed to facilitate silicon migration to repair any etch damage, as well as to slightly smoothen the silicon surface for the subsequent epitaxy process.

Embodiments of the invention advantageously selectively form stressor layers on crystalline surfaces instead of poly-crystalline surfaces. In an embodiment, SiC selectively forms within the recess 310 upon the crystalline substrate 110 rather than on the poly silicon gate electrode 120 or the STI region 127. In another embodiment of the invention, a SiGe stressor is selectively formed.

Figure 4:
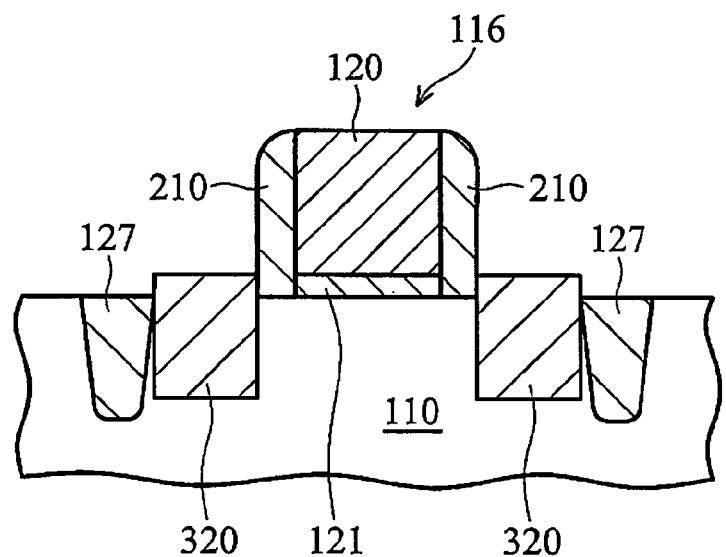

FIG. 4 illustrates the intermediate MOS device 116 of FIG. 3 after selective epitaxial growth (SEG) of an embedded stressor 320. Preferably, the embedded stressor 320 has a lattice spacing different than the substrate 110. In an embodiment of the invention, the embedded stressor 320 comprises SiGe, which has a lattice spacing greater than the silicon substrate 110. The SiGe embedded stressor 320 exerts a compressive stress on the channel region 125, and the MOS device 116 is preferably a PMOSFET. In another embodiment of the invention, the embedded stressor 320 comprises SiC, which has a lattice spacing less than the silicon substrate 110. The SiC embedded stressor 320 exerts a tensile stress on the channel region 125, and the MOS device 116 is preferably an NMOSFET. The embedded stressor may comprise SiC, SiGe, Si, Ge, C, and combinations thereof.

During epitaxial growth of the embedded stressor 320, silicon precursor (e.g., silane or dichlorosilane) is flown concurrently into the process chamber with a carrier gas (e.g., H2 and/or N2) and an etchant, preferably HCl. Etchants are utilized to control the areas on the device to be free of deposited SiGe or SiC. In preferred embodiments of the invention, etchants provide for the selective formation of stressor layers on crystalline surfaces instead of polycrystalline surfaces. Suitable etchants may include HCl, HF, HBr, and Cl2, although other etchants are within the contemplated scope of the invention.

The flow rate of the silicon precursor is in the range from about 5 sccm to about 500 sccm, preferably from about 50 sccm to about 200 sccm, and more preferably about 130 sccm. The flow rate of the carrier gas is from about 10 slm to about 50 slm, and more preferably about 30 slm. The flow rate of the etchant is from about 10 sccm to about 500 sccm, preferably from about 20 sccm to about 100 sccm, and more preferably about 90 sccm. The process chamber is maintained with a pressure from about 10 Torr to about 200 Torr, preferably about 10 Torr. The substrate is kept at a temperature in the range from about 500° C. to about 1,000° C., preferably from about 600° C. to about 800° C., and more preferably from about 650° C. to about 750° C., for example about 660° C. The mixture of reagents is thermally driven to react and epitaxially form crystalline silicon. The mixture of reagents may also comprise Si, Ge, H, Cl, B, or combinations thereof. The HCl etches deposited stressor material (e.g., SiGe, SiC) from the surface polycrystalline features.

The mixture of reagents may include dopants to provide the epitaxial layers having desired conductive characteristics. In one embodiment, the epi-layer is doped p-type, such as by using diborane ($B_2H_6$), or $B_{10}H_{14}$, $B_{18}H_{22}$, or the like, to add boron at a concentration in the range from about 10E15 atoms/cm$^3$ to about 10E21 atoms/cm$^3$, more preferably in the range of from about 10E19 atoms/cm$^3$ to about 10E21 atoms/cm$^3$. In another embodiment, the epilayer is doped n-type, such as with phosphorus and/or arsenic to a concentration in the range from about 10E15 atoms/cm$^3$ to about 10E21 atoms/cm$^3$, more preferably in the range of from about 10E19 atoms/cm$^3$ to about 10E21 atoms/cm$^3$.

An epitaxial layer in the range of about 1 nm to about 300 nm thick may be formed. In an embodiment comprising a SiGe layer, the germanium concentration may be graded within the SiGe film, preferably graded with a higher germanium concentration in the lower portion of the SiGe film than in the upper portion of the SiGe film, although a higher germanium concentration in the upper portion of the film is within the contemplated scope of the invention. The germanium concentration preferably ranges from about 1 atomic percent (henceforth "at %") to about 35 at % of the SiGe compound, and more preferably from about 23 at % to about 25 at % at the high end of the range. In other preferred embodiments, the SiGe film has a constant gemanium concentration. Additionally, the epitaxial layer could be a multi-layer configuration in which sub-layers of constant or differing materials are employed. The total thickness of the resulting film is preferably in the range from about 300 Å to about 1500 Å.

In one example, a deposition temperature between about 630° C. and about 680° C. yielded an embedded SiGe stressor comprising between about 22 at % and about 26 at % Ge. The epitaxial growth rate on the substrate was between about 0.240 Å/sec and about 0.355 Å/sec, while the corresponding epitaxial growth on polycrystalline surfaces between about 0.0 Å/sec and 0.118 Å/sec. Etching of deposited stressor from polycrystalline surfaces according embodiments of the invention yield etch rates between about 0.091 Å/sec and about 0.616 Å/sec.

In an embodiment comprising SiC, the carbon concentration may also be graded within the SiC film, although a constant carbon concentration film may be more preferable. IN some embodiments, a multi-layer film is contemplated. For a graded SiC film embodiment, the carbon concentration is preferably higher in the lower portion of the SiC film than in the upper portion of the SiC film. The carbon concentration of the SiC film ranges from about 200 ppm to about 5 at %, preferably from about 1 at % to about 3 at %, more preferably about 1.5 at %. In other embodiments, the etching may comprise a separate step that follows the deposition step.

Following the embodiments described above, the MOS device 116 is completed using conventional semiconductor processing steps as are known in the art. For example, a silicide may be formed by depositing a metal such as titanium or cobalt and then treated to form self-aligned silicide, or salicide, on top of the gate electrode and the source/drain regions and other areas to provide a lower resistance and improve device performance. Following the salicide step, interlevel insulation layers are formed above the substrate using deposition steps to deposit oxide, nitride or other conventional insulation layers. Contact areas are patterned and etched into the insulators to expose the source, drain and gate electrodes, the resulting vias are filled with conductive material to provide electrical connectivity from metallization layers above the interlevel insulating layers down to the gate electrodes, the source and the drain regions. Metallization layers of aluminum, or copper, may be formed over the interlevel insulation layers using known techniques such as a aluminum metallization process or a dual damascene copper metallization process to provide one, or several, wiring layers that may contact the vias and make electrical connections to the gate electrodes and the source and drain regions.

Embodiments of the invention provide for fabrication of strained semiconductors using a hard mask free source/drain process. Other advantages include preventing an extra recessing from forming in the substrate near the gate electrode sidewall spacers from a second hard mask removal (NMOS). Advantages may also include Rext and Xj reduction along with Ion/Ioff improvement, and NMOS Idsat improvement. Yet still other advantageous features may include reducing poly depletion and improved FUSI metal gate integration. This may arise because during processing, the poly gate may be etched back during the process step of forming the source and drain resources. It is easier to fully silicide the lowered poly gate structure. Likewise, greater dopant implantation can be achieved, with the same implant energy, with a lower poly gate height.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor fabrication method, the method comprising:
   forming a gate electrode formed over a substrate;
   forming a recess in the substrate on either side of the gate electrode; and
   forming an epitaxial stressor layer in the recess using a reaction mixture having an etchant, the epitaxial stressor layer comprising a stressing material with a concentration gradient;
   wherein the etchant provides for selective formation of the epitaxial stressor layer on a crystalline surface, and prevents formation of the epitaxial stressor layer on an unmasked polycrystalline gate surface.

2. The method of claim 1 wherein the epitaxial stressor layer has a lattice spacing different from a substrate lattice spacing.

3. The method of claim 2, wherein the lattice spacing of the epitaxial stressor layer is about 0.2% different from the substrate lattice spacing.

4. The method of claim 1, wherein the substrate comprises a material selected from the group consisting essentially of Si, Ge, SiGe, silicon on insulator (SOI), silicon germanium on insulator (SGOI), and combinations thereof.

5. The method of claim 1, wherein the epitaxial stressor layer comprises a material selected from the group consisting essentially of SiGe, SiC, Si, Ge, C, and combinations thereof.

6. The method of claim 1 wherein the recess is between about 10 nm and 300 nm deep.

7. A semiconductor fabrication method, the method comprising:
   forming a recess in a substrate; and
   forming an epitaxial layer in the recess by exposing the substrate concurrently to an environment containing precursor gasses to the epitaxial layer and etchant gasses, the epitaxial layer comprising a stressor material that has a first concentration at a first point in the epitaxial layer and a second concentration different from the first concentration at a second point in the epitaxial layer;
   wherein the etchant gasses provide for selective formation of the epitaxial layer on a crystalline surface, and prevent formation of the epitaxial layer on an unmasked polycrystalline gate surface.

8. The method of claim 7, further comprising, during the forming an epitaxial layer step:
   maintaining an ambient pressure between about 1 torr and about 50 torr; and
   maintaining a substrate temperature between about 500° C. and about 750° C.

9. The method of claim 8, further comprising maintaining the substrate temperature between about 550° C. and about 750° C.

10. The method of claim 7, wherein the substrate comprises a material selected from the group consisting essentially of Si, Ge, SiGe, silicon on insulator (SOI), silicon germanium on insulator (SGOI), and combinations thereof.

11. The method of claim 7, wherein the epitaxial layer comprises a material selected from the group consisting essentially of SiGe, SiC, Si, Ge, C, and combinations thereof.

12. The method of claim 7, further comprising etching the substrate using a gaseous etchant.

13. The method of claim 12, wherein the gaseous etchant is selected from the group consisting essentially of HF and HCl.

14. The method of claim 7, wherein the recess is between about 10 nm and 300 nm deep.

15. A method of forming a strained semiconductor structure, the method comprising:
   forming a polycrystalline gate electrode on a substrate;
   forming a recess in the substrate on either side of the polycrystalline gate electrode; and
   selectively forming an epitaxial layer in the recess and not on the polycrystalline gate electrode by simultaneously exposing the recess and the polycrystalline gate electrode to a gas comprising a stressor precursor, a carrier gas, and an etchant, the epitaxial layer comprising a stressor material at differing concentrations;
   wherein the polycrystalline gate electrode is not masked during the step of forming the epitaxial layer.

16. The method of claim 15, further comprising maintaining an ambient pressure between about 1 torr and about 50 torr, and maintaining a substrate temperature between about 500° C. and about 750° C.

17. The method of claim 15, wherein the stressor precursor is selected from the group consisting essentially of $GeH_4$, $G_2H_6$, $SiH_2Cl_2$, $SiH_4$, HCl, HBr, SiC, $C_2H_4$, $Cl_2$, and combinations thereof.

18. The method of claim 15, wherein the etchant is selected from the group consisting essentially of HF and HCl.

19. The method of claim 15 further comprising introducing impurities into the epitaxial layer.

20. The method of claim 19 wherein the stressor material imposes a tensile stress on the substrate.

* * * * *